United States Patent [19]

Shimbo et al.

[11] Patent Number: 4,738,935
[45] Date of Patent: * Apr. 19, 1988

[54] METHOD OF MANUFACTURING COMPOUND SEMICONDUCTOR APPARATUS

[75] Inventors: Masaru Shimbo; Hiromichi Ohashi, both of Yokohama; Kazuyoshi Furukawa, Kawasaki; Kiyoshi Fukuda, Yokohama, all of Japan

[73] Assignee: Kabushiki Kaisha Toshiba, Kawasaki, Japan

[*] Notice: The portion of the term of this patent subsequent to Jan. 27, 2004 has been disclaimed.

[21] Appl. No.: 809,193

[22] Filed: Dec. 16, 1985

[30] Foreign Application Priority Data

Feb. 8, 1985 [JP] Japan .................... 60-22932

[51] Int. Cl.$^4$ .................... H01L 21/302; H01L 21/76
[52] U.S. Cl. .................... 437/31; 65/57.3; 148/DIG. 12; 148/DIG. 151; 156/273.9; 357/49; 357/50; 357/55; 437/208; 437/225; 437/746
[58] Field of Search .............. 148/DIG. 17, DIG. 54, 148/DIG. 72, DIG. 12, 33.4, 1.5; 156/645

[56] References Cited

U.S. PATENT DOCUMENTS 3,239,908  3/1966  Nakamura ................. 148/DIG. 12
3,351,502  11/1967  Rediker ............................ 148/177
4,451,843  5/1984  Dahlberg ............................ 357/36
4,638,552  1/1987  Shimbo et al. ................... 29/576 W

FOREIGN PATENT DOCUMENTS 60-51700 of 1985 Japan .

OTHER PUBLICATIONS

A. G. Milnes et al., "Heterojunctions and Metal-Semiconductor Junctions", Academic Press, New York, 1972; pp. 226–281.
P. M. Campbell et al., "150 Volt Channel GaAs FET", IEDM Technical Digest, 1982, pp. 258–260.

Primary Examiner—Brian E. Hearn
Assistant Examiner—Beverly A. Pawlikowski
Attorney, Agent, or Firm—Oblon, Fisher, Spivak, McClelland & Maier

[57] ABSTRACT

A method of manufacturing a compound semiconductor device has the steps of mirror-polishing a surface of each of two compound semiconductor substrates, bringing the mirror-polished surfaces of the two compound semiconductor substrates in contact with each other in a clean atmosphere and in a state wherein substantially no foreign substances are present therebetween, and annealing the compound semiconductor substrates which are in contact with each other so as to provide a bonded structure having a junction with excellent electrical characteristics at the interface.

11 Claims, 6 Drawing Sheets

```
┌─────────────────────────────┐
│                             │
│        n - GaAs             │──11
│                             │
└─────────────────────────────┘

┌─────────────────────────────┐
│                             │
│        p - InP              │──12
│                             │
└─────────────────────────────┘
```

F I G. 3A
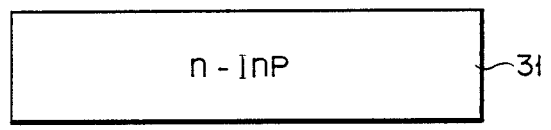
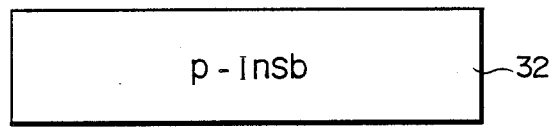
F I G. 3B
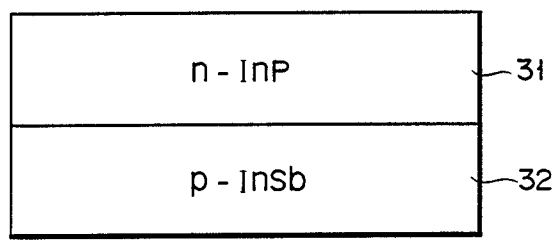
F I G. 3C
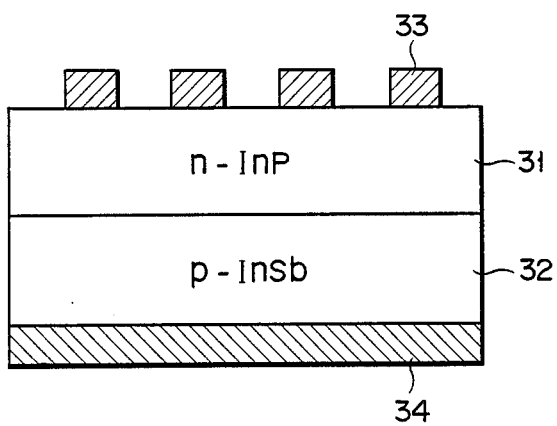

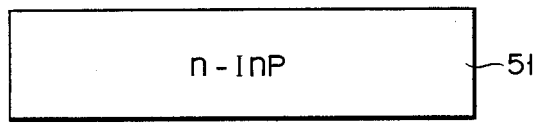
FIG. 5A
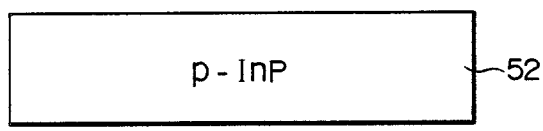
FIG. 5B
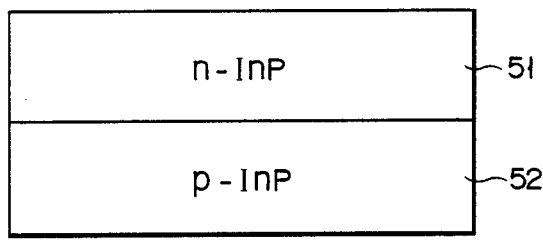
FIG. 5C
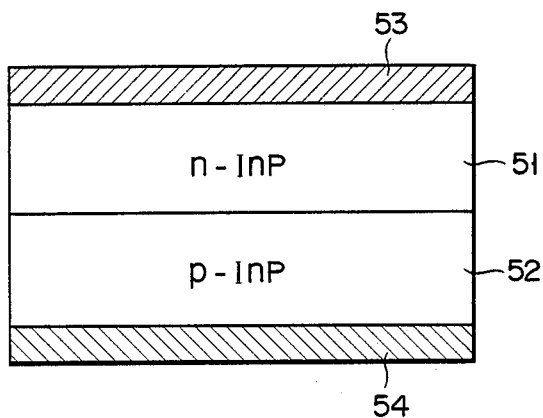

METHOD OF MANUFACTURING COMPOUND SEMICONDUCTOR APPARATUS

BACKGROUND OF THE INVENTION

1. Field of the Invention

The present invention relates to a method of manufacturing a semiconductor device, and, more particularly, to a method of providing a bonded structure of two compound semiconductor substrates.

2. Description of the Prior Art

A semiconductor device using a compound semiconductor such as GaAs has recently been attracting a great deal of attention in the fields of super high speed semiconductor devices and power semiconductor devices. In order to fully utilize advantages of such a compound semiconductor device, a technique for forming a junction between semiconductor layers having different impurities or conductivity types is required. Various types of epitaxial growth methods are known to form such a junction. However, it is very difficult to control the thickness and impurity concentration of an epitaxial layer within a wide range. For example, when a compound semiconductor device exhibiting a high breakdown voltage is manufactured, an epitaxial layer having a low impurity concentration and a considerable thickness must be formed in order to form a depletion layer and increase the breakdown voltage.

Liquid phase epitaxy is known as a technique for forming an epitaxial layer of a considerable thickness. In accordance with liquid phase epitaxy, it is comparatively easy to increase the thickness of an epitaxial layer. However, when a GaAs semiconductor device is formed, it is difficult to form an epitaxial layer having an impurity concentration of $10^{16}$ to $10^{17}/cm^3$ or lower. As a result, the avalanche voltage cannot be controlled because of the high impurity concentration, and a breakdown voltage of more than several tens of V cannot be obtained.

On the other hand, in accordance with vapor phase epitaxy, the impurity concentration of an epitaxial layer can be controlled to as low as about $10^{14}$ to $10^{15}/cm^3$. However, it is very difficult to form an epitaxial layer having a thickness of 10 to 20 $\mu m$ or more. If the thickness of an epitaxial layer is small, the punch-through voltage is low. Therefore, a breakdown voltage of only 200 to 300 V can be conventionally provided.

Meanwhile, a junction between different types of compound semiconductors having different band gaps can be applied as a heterojunction to various semiconductor elements. Various epitaxial growth methods are available for forming such a heterojunction. However, for epitaxial growth, in accordance with the epitaxial growth method, a semiconductor layer having a band gap different from that of an underlying semiconductor layer, the lattice constants of the semiconductor layers must basically match. Only a very, small number of combinations such as GaAs and AlGaAs can provide a good heterojunction. In many cases, crystal defects occur due to a strain resulting from lattice mismatch, or a barrier layer may undesirably form.

As another means for forming a heterojunction, a technique for bonding semiconductor substrates of different types by hot pressing or fusion bonding is known. However, the hot pressing requires high temperature and high pressure, and the fusion bonding is accompanied by fusion of the substrates. Therefore, many defects occur in the substrates and a thick interlayer is formed at the bonded interface, impairing electrical characteristics. When an impurity region is formed in one substrate, it is almost impossible to maintain its impurity concentration distribution after bonding, since a high temperature heating step is required.

SUMMARY OF THE INVENTION

It is an object of the present invention to provide a method of manufacturing a compound semiconductor device wherein two compound semiconductor substrates having given impurity concentrations and thicknesses are bonded, thereby forming a junction with good electrical characteristics, irrespective of lattice constant mismatch therebetween.

A method of manufacturing a compound semiconductor device according to the present invention is characterized by comprising the steps of:

mirror-polishing a surface of each of two compound semiconductor substrates;

bringing the mirror-polished surfaces of the two compound semiconductor substrates in contact with each other in a clean atmosphere and in a state wherein substantially no foreign substances are present therebetween; and annealing the compound semiconductor substrates which are in contact with each other so as to provide a bonded structure.

The method according to the present invention will be described in detail.

Two semiconductor substrates are prepared and their surfaced to be bonded are mirror-polished. The smoothness and cleanliness of polished surfaces of the substrates are significant in obtaining a bonded compound semiconductor structure having good bonding strength and a junction with good electrical characteristics in accordance with the method of the present invention. Surfaces of the substrates can be mirror-polished by grinding and polishing using a conventional lapping machine, and, more particularly, by mechano-chemical polishing used for polishing various types of semiconductor substrates. The smoothness, e.g., the surface roughness of the polished surfaces of the substrates is preferably less than 500 Å, and more preferably less than 50 Å. Note that the surface roughness is given by a maximum height (Rmax) determined in accordance with JIS B-0601 (1982).

Then, normally, the polished surfaces of the substrates are cleaned. Washing with water, alcohol, organic solvent or the like and drying thereafter are performed as part of a cleaning method. When the polluted degree of the polished surface is high, degreasing, preferably with boiling trichlene, is performed. If an excessive natural oxide film is formed on the polished surfaces for a long period of time after polishing, it must be removed with boiling hydrochloric acid. Washing with clean water and drying must be performed after this treatment. Drying is preferably performed using a spinner. After cleaning, no foreign substance should be present on the polished surfaces of the substrates.

Thereafter, the polished surfaces of the substrates are brought into contact with each other in a clean atmosphere of class 1 or lower. Note that class 1 represents a degree of cleanliness wherein one dust particle having a particle diameter of 0.5 $\mu m$ or more is present per cubic foot of atmosphere. If the polished surfaces are brought into contact with each other long after washing and drying, the film thickness of the natural oxide film of some compound semiconductors may be too great, adversely affecting the electrical characteristics of the junction. For this reason, the two surfaces are preferably brought into contact with each other within five minutes of washing and drying.

When the substrates are annealed at a temperature of 200° C. or higher, but below the melting point of the substrates, while the polished surfaces are in contact with each other, a bonded structure with high bonding strength can be produced. Annealing is preferably performed in an inert or reducing atmosphere. If annealing is performed at a temperature below 200° C., the bonding strength is weakened and electrical characteristics at the junction are poor. On the other hand, if annealing is performed at a temperature higher than the melting point of the compound semiconductor, the condition is the same as that produced in fusion bonding. Then, a thick interlayer is formed at the bonded portion, more crystal defects form, and electrical characteristics at the junction are poor. Therefore, although the adequate annealing temperature depends on the type of compound, it is usually from 300° to 600° C.

When the difference in the thermal expansion coefficient between the compound semiconductor substrates to be bonded is large, the substrates may crack during annealing. In order to prevent cracking of the substrates, it is preferable that the difference in thermal expansion coefficient between the compound semiconductor substrates be below $2 \times 10^{-6}$/°C.

Combinations of different types of semiconductor substrates include GaAs/InP, ZnS/GaAs, InP/InSb, GaP/InP and CdS/InP. Combinations of the same types of semiconductor substrates include GaAs/GaAs and InP/InP. When the conductivity type, the impurity concentration and the formation portion of the impurity portion are properly selected, various types of diodes and transistors can be produced.

A mechanism of bonding the compound semiconductor substrates according to the present invention is not yet clearly known in detail. However, the natural oxide film formed on the surface of the substrate during washing and drying of the substrate and before contacting is assumed to play an important role. In the case of GaAs, for example, the thickness of the natural oxide film is confirmed to be 10 to 30 Å by Lukes (Surface Sci. Vol. 30, (1972) p91). When two kinds of semiconductor substrates are brought into contact with each other, they are supposed to be firmly bonded with each other through the $H_2O$ molecules adsorbed in the natural oxide film by hydrogen bonds. It is confirmed that, if mirror-polished surfaces of semiconductor substrates are brought into contact with each other in a vacuum, the substrates can be bonded to each other. It is thus deduced that the bonding force does not depend only on atmospheric pressure. It is assumed that, when the temperature of the bonded semiconductor substrates is increased, dehydration condensation will occur and constituent atoms of the semiconductor substrates will be bonded to each other through oxygen. Since excessive oxygen at the bonded interface is diffused in the substrates by annealing, alignment at the interface is improved, thereby providing more stable electrical characteristics. Condensation of oxygen was not detected by actually checking a bonded interface with an X-ray microanalyzer. This is attributable to the face that the oxygen condensed layer vanished by oxygen diffusion into the bulk, or it is so thin that it cannot be detected by an X-ray microanalyzer having a resolution of 1 to 2 $\mu$m.

According to the present invention, compound semiconductor substrates having given impurity concentrations and conductivity types can easily be bonded, electrically and mechanically, with each other to provide a bonded structure. Since a high temperature step for fusing the substrate is not used in bonding of the substrates, crystal defects and formation of an interlayer at the bonded interface do not occur, thereby providing a bonded structure with good electrical characteristics. It is difficult to manufacture high-speed elements, elements with a high breakdown voltage, highly efficient solar cell, or photodiodes having a sensitivity within a wide wavelength range using only the epitaxial growth method. However, in accordance with the present invention, such elements can be manufactured. According to the present invention, compound semiconductor substrates are bonded with each other at room temperature, and then annealed. Therefore, degradation of the bonded interface which is inherent in the compound semiconductor device formation process can be prevented.

BRIEF DESCRIPTION OF THE DRAWINGS

FIGS. 3A to 3C are sectional views showing the manufacturing process of the device of Example 3;

FIGS. 5A to 5C are sectional views showing the manufacturing process of the device of Example 5.

DESCRIPTION OF THE PREFERRED EMBODIMENTS

Embodiments of the present invention will now be described with reference to the accompanying drawings.

EXAMPLE 1

Figure 1A:
FIGS. 1A to 1C are sectional views showing the manufacturing process of the device of Example 1.
Figure 1B:
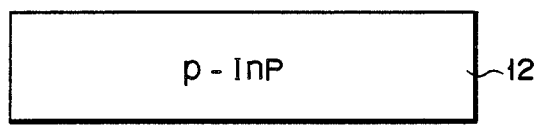

As shown in FIG. 1A, a mirror-polished Si doped (111) n-type GaAs substrate 11 having an impurity concentration of $10^{16}$/cm$^3$, and a mirror-polished Zn doped (111) p-type InP substrate 12 having an impurity concentration of $10^{18}$/cm$^3$ were prepared. The substrates 11 and 12 were degreased in boiling trichlene. Then, substrate 11 was immersed in concentrated boiling hydrochloric acid for two minutes, washed with water and dried by a spinner. Substrate 12 was immersed in a solution of $H_2SO_4$:$H_2O_2$:$H_2O$ = 1:1:4 (volume ratio) for two to three minutes, washed and then dried by a spinner. After the above treatment, substrates 11 and 12 were brought into contact and bonded with each other in a clean room of class 1, as shown in FIG. 1B. The resultant bonded structure was annealed in a hydrogen furnace at a temperature of 450° C. for one hour to provide a firmly bonded structure.

Figure 1C:
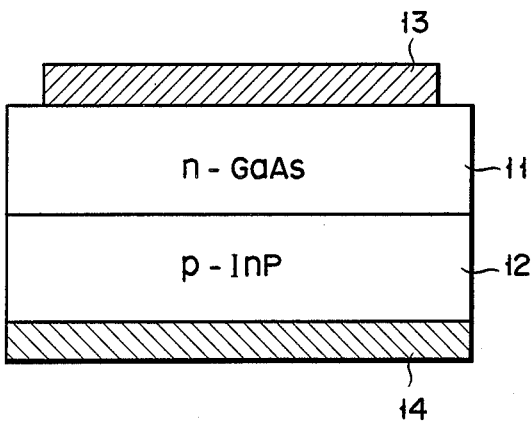

The bonded substrate structure was cut into a square with 3 mm sides, using a diamond blade. An AuBe electrode 14 was deposited on substrate 12 as shown in FIG. 1C. Then, an AuGe alloy piece was placed on substrate 11 and heated at 500° C. for 30 minutes to provide AuGe electrode 13.

When V-I characteristics of the obtained diode were measured with a curve tracer, good diode characteristics were evident.

EXAMPLE 2

Figure 2A:
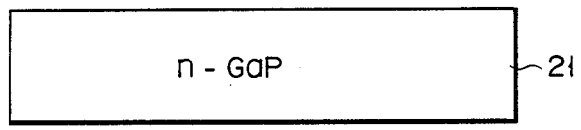
FIGS. 2A to 2C are sectional views showing the manufacturing process of the device of Example 2.
Figure 2B:
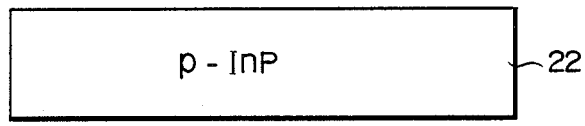

As shown in FIG. 2A, mirror-polished n-type GaP substrate 21 having an impurity concentration of $10^{14}/cm^3$, and mirror-polished p-type InP substrate 22 having an impurity concentration of $10^{18}/cm^3$ were prepared. Both substrates 21 and 22 have crystal orientations (100). Substrates 21 and 22 were degreased by treatment with boiling trichlene, replacement with ethanol and washing with water. Then, the substrates 21 and 22 were immersed in a solution of $H_2O_2:H_2SO_4:H_2O = 1:4:1$ (volume ratio) for one minute, and washed quickly. After the above treatment, substrates 21 and 22 were brought into contact and bonded with each other in a clean room of class 1, as shown in FIG. 2B. The resultant bonded structure was annealed in a hydrogen furnace at a temperature of 450° C. for one hour to provide a firmly bonded structure.

Figure 2C:
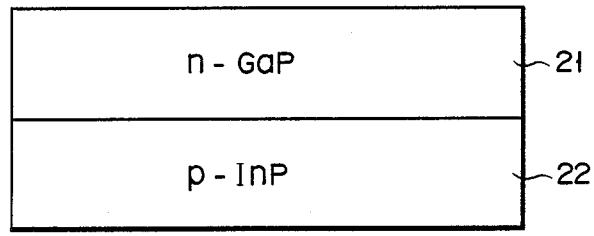

As shown in FIG. 2C, an AuGe alloy was deposited on substrate 21, and then an AuZn alloy was deposited on substrate 22, of the resultant bonded structure, and the structure was annealed at 400° C. for one hour to provide ohmic electrodes 23 and 24.

The diode obtained was confirmed, by curve tracer, to exhibit good diode characteristics. The diode exhibited a forward direction temperature characteristic substantially coincident with a predicted value.

EXAMPLE 3

As shown in FIG. 3A, mirror-polished n-type InP substrate 31 having an impurity concentration of $10^{15}/cm^3$, and a mirror-polished p-type InSb substrate 32 having an impurity concentration of $10^{18}/cm^3$ were prepared. Substrates 31 and 32 were degreased by treatment with boiling trichlene and replacement with ethanol. Thereafter, the surface of substrate 31 was cleaned in accordance with the same steps as in Example 2. Substrate 32 was immersed in concentrated phosphoric acid for one minute, washed with water and dried by spinner. The mirror-polished surfaces of substrates 31 and 32 were brought into contact with each other in a clean room of class 1, as shown in FIG. 3B, and then annealed in a hydrogen furnace at a temperature of 400° C. for one hour.

As shown in FIG. 3C, AuGe alloy lattice-shaped electrode 33 was formed on substrate 31, and then AuZn alloy electrode 34 was formed on the entire surface of substrate 33 of the resultant bonded structure, thereby completing the formation of a photodiode.

The obtained photodiode was cooled by liquid nitrogen and its photovoltaic characteristic was measured. As a result, a photovoltaic effect was observed in a light with a wavelength of up to about 6 μm.

EXAMPLE 4

In the above Examples, conductive substrates of different materials having different conductivity types were used to manufacture a photodiode. However, according to Example 4, a static induction transistor was manufactured using substrates of the same type.

Figure 4A:
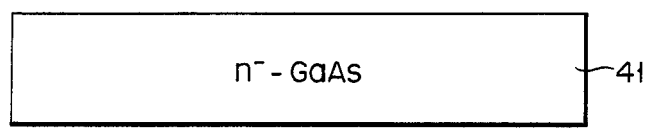
FIGS. 4A to 4F are sectional views showing the manufacturing process of the static induction transistor of Example 4.
Figure 4B:
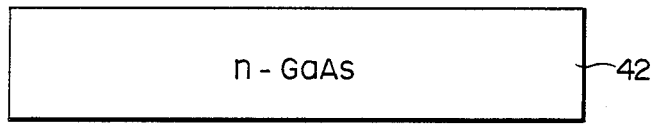
Figure 4C:
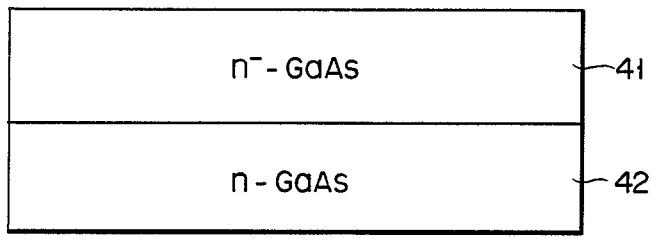

As shown in FIG. 4A, mirror-polished $n^-$-type GaAs substrate 41 having an impurity concentration of $10^{14}/cm^3$ and mirror-polished n-type GaAs substrate 42 having an impurity concentration of $10^{18}/cm^3$ were prepared. The substrates 41 and 42 were degreased in boiling trichlene, boiled in concentrated hydrochloric acid for two minutes, washed with water and dried by a spinner. The mirror-polished surfaces of substrates 41 and 42 were brought into contact with each other in a clean room of class 1, as shown in FIG. 4B, and annealed in a hydrogen furnace at a temperature of 500° C. for one hour, thereby providing a firmly bonded structure. Substrate 41 of the bonded structure was polished to a thickness of 60 μm. Be was ion-implanted into substrate 41 to form p-type buried gate layer 43 having an impurity concentration of about $1 \times 10^{18}/cm^3$, as shown in FIG. 4C.

Figure 4D:
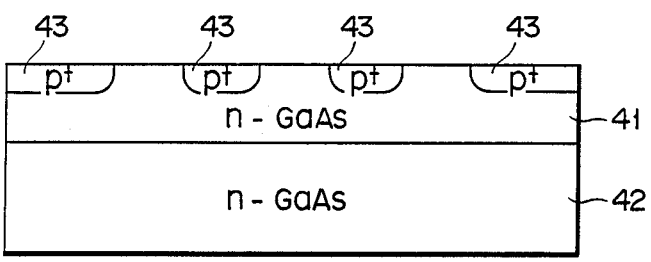

Then, as shown in FIG. 4D, mirror-polished $n^-$-type GaAs substrate 44 was bonded to a surface of the layer 43 of the bonded structure. Bonding together with a pretreatment of the substrate before bonding was performed under conditions similar to those in the first bonding step. The obtained structure was annealed in a temperature (800° C. for 30 minutes) sufficient to activate the previously ion-implanted Be.

Figure 4E:
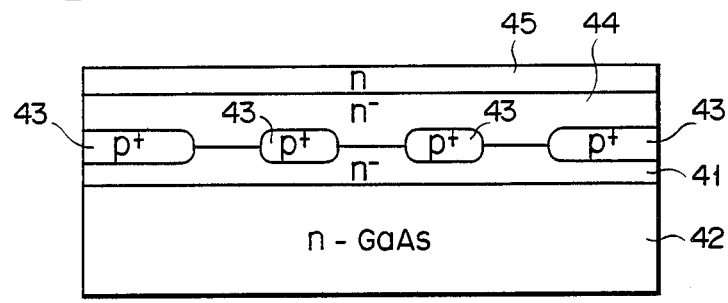
Figure 4F:
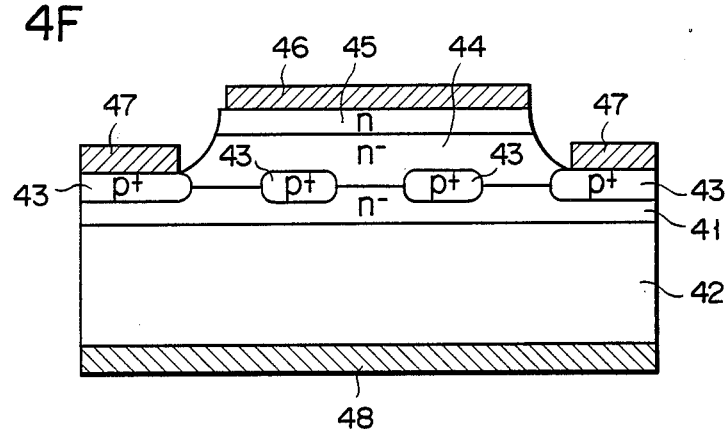

As shown in FIG. 4E, the substrate 44 was polished to a thickness of about 10 μm. An n-type GaAs layer 45 having an impurity concentration of about $1 \times 10^{18}/cm^3$ and a thickness of about 0.5 μm was epitaxially formed on the substrate 44. As shown in FIG. 4F, mesa-etching was performed in accordance with dry etching to expose layer 43, and an AuGe alloy was deposited on the upper and lower surfaces of the structure. The obtained structure was annealed at a temperature of 400° C. in an inert gas, thus forming drain electrode 48, source electrode 46 and gate electrode 47.

The obtained static induction transistor exhibited a breakdown voltage of more than 600 V. The bonded interfaces were annealed after bonding so that the interface of GaAs was not degraded by annealing. Therefore, degradation in electrical characteristics such as decreased breakdown voltage and increased forward voltage drop were not observed.

EXAMPLE 5

As shown in FIG. 5A, mirror-polished Sn doped n-type InP substrate 51 having an impurity concentration of $2 \times 10^{18}/cm^3$, and mirror-polished Zn doped p-type InP substrate 52 having an impurity concentration of $5 \times 10^{18}/cm^3$ were prepared. Both substrates 51 and 52 have a crystal orientation (100), a diameter of 2 inches and a thickness of 300 μm. Substrates 51 and 52 were degreased in boiling trichlene which was then substituted with ethanol. Then, substrates 51 and 52 were treated by a solution of $H_2SO_4:H_2O_2:H_2O = 4:1:1$ (volume ratio) at 30° C. for one minute, washed with water and dried by a spinner. Substrates 51 and 52 were brought into contact with each other in a clean room of class 1, as shown in FIG. 5B, so that the mirror-polished surfaces thereof bonded with each other.

An AuGe alloy was deposited on substrate 51, and an AuZn alloy was deposited on substrate 52 of the resultant bonded substrate, which was then annealed at 400° C. for 15 minutes to provide ohmic electrodes 53 and 54 as shown in FIG. 5C.

The obtained pn junction diode was cut to a pellet having 3 mm sides, and V-I characteristics thereof were confirmed, by curve tracer, to exhibit good diode characteristics having a high breakdown voltage.

What is claimed is:

1. A method of manufacturing a compound semiconductor device, comprising the steps of:

mirror-polishing a surface of each of two compound semiconductor substrates;

bringing the mirror-polished surfaces of the two compound semiconductor substrates in contact with each other in a clean atmosphere and in a state wherein substantially no foreign substances are present therebetween; and annealing the compound semiconductor substrates which are in contact with each other under a reducing or inert atmosphere at a temperature of not less than 200° C. but below the melting point of the compound semiconductors so as to provide a bonded structure.

2. The method according to claim 1, wherein the compound semiconductor substrates comprise compound semiconductors of different types.

3. The method according to claim 2, wherein a combination of the compound semiconductors is a member selected from the group consisting of GaAs/InP, ZnS/GaAs, InP/InSb, GaP/InP and CdS/InP.

4. The method according to claim 1, wherein the compound semiconductor substrates comprise a compound semiconductor of the same type.

5. The method according to claim 4, wherein the compound semiconductor is a member selected from the group consisting of GaAs and InP.

6. The method according to claim 1, wherein the compound semiconductor substrates have different conductivity types, and a pn junction is formed at the bonded interface thereof.

7. The method according to claim 6, wherein the compound semiconductor device comprises a diode.

8. The method according to claim 1, wherein the compound semiconductor substrates have the same conductivity types, an impurity region having an opposite conductivity type to that of the substrates is formed on a part of the polished surface of the one of the two substrates, and a pn junction is formed at an interface of the impurity region and another of the substrates.

9. The method according to claim 1, wherein the mirror-polished surfaces have a roughness of not more than 500 Å.

10. The method according to claim 1, wherein the substrates are annealed at a temperature of 300° to 600° C.

11. The method according to claim 1, which further comprises cleaning said mirror-polished surfaces before said surfaces are brought into contact.

* * * * *